United States Patent [19]

Garskamp

[11] 4,107,615

[45] Aug. 15, 1978

[54] RECEIVER INCLUDING AN AUTOMATIC TUNING CORRECTION SUPPRESSION CIRCUIT COUPLED TO THE TUNING MEMBER

[75] Inventor: Arnoldus Garskamp, Eindhoven, Netherlands

[73] Assignee: U.S. Philips Corporation, New York, N.Y.

[21] Appl. No.: 714,771

[22] Filed: Aug. 16, 1976

[30] Foreign Application Priority Data

Aug. 28, 1975 [NL] Netherlands ............... 7510149

[51] Int. Cl.² ............................................. H04B 1/16
[52] U.S. Cl. ........................... 325/420; 325/457; 334/16
[58] Field of Search ............. 325/335, 346, 418, 420, 325/421, 422, 423, 464, 457; 358/195; 334/16

[56] References Cited

U.S. PATENT DOCUMENTS

| 2,294,100 | 8/1942 | Travis | 325/417 |
|---|---|---|---|
| 3,806,817 | 4/1974 | Uchida | 358/195 |
| 3,906,372 | 9/1975 | Schatter et al. | 325/418 |
| 3,939,427 | 2/1976 | Mueller | 325/418 |
| 3,962,643 | 6/1976 | Ma | 325/464 |

*Primary Examiner*—Robert L. Griffin
*Assistant Examiner*—Marc E. Bookbinder
*Attorney, Agent, or Firm*—Frank R. Trifari; Henry I. Steckler

[57] ABSTRACT

By using a double potentiometer one of which is used for tuning and the other for adjusting a level whose variation suppresses an automatic tuning correction, a great freedom can be obtained in designing the tuning section of a receiver with automatic tuning correction suppression.

1 Claim, 1 Drawing Figure

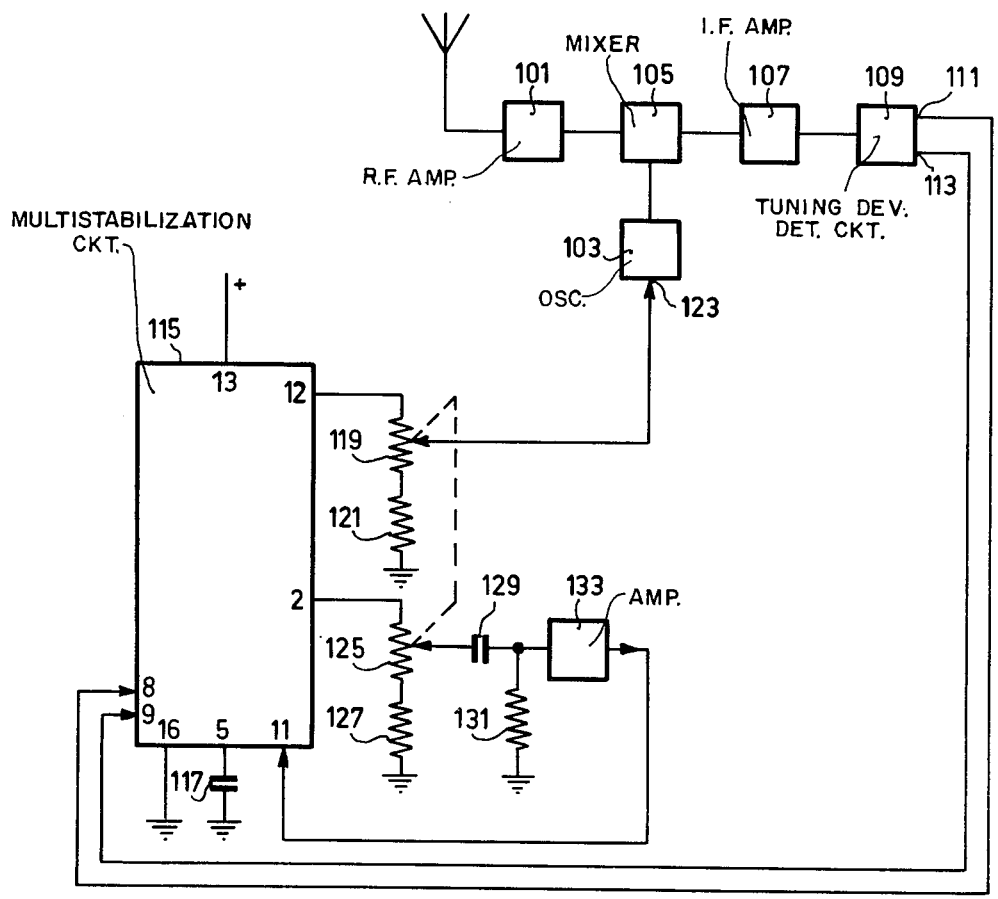

RECEIVER INCLUDING AN AUTOMATIC TUNING CORRECTION SUPPRESSION CIRCUIT COUPLED TO THE TUNING MEMBER

The invention relates to a receiver including an automatic tuning correction suppression circuit coupled to a tuning member for rendering the automatic tuning correction inactive during operation of the tuning member in which a level variation detector is coupled to a level adjusting circuit coupled to the tuning member, an output of the level variation detector being coupled to a control signal input of the tuning correction suppression circuit in accordance with U.S. Pat. No. 3,968,437.

The above cited patent describes a receiver of the above-mentioned kind in which the tuning potentiometer forms part of the level adjusting circuit. In that receiver the automatic tuning correction signal is added to the tuning signal obtained from the tuning correction member in a circuit following the input tap of the level detection circuit.

It is an object of the invention to provide a receiver which offers greater freedom of design of the automatic tuning correction circuit.

A receiver of the kind according to the invention mentioned in the preamble is therefore characterized in that the tuning member is a tuning potentiometer to which a level adjusting potentiometer is coupled which is part of the level adjusting circuit.

The circuit for detecting a level change on tuning is now kept entirely outside the tuning circuit so that an automatic tuning signal which is introduced into that circuit does not affect the level detection circuit in an undesired manner. Furthermore, the circuit can be used for both manual and motor tuning and reacts to the switch-on of the supply voltage so that no undesired transmitter can be caught when the receiver is switched on.

The invention will be further explained with reference to the drawing which only contains one FIGURE which illustrates a receiver according to the invention by means of a block diagram.

The receiver has an RF section 101, a mixer circuit 105 coupled to this section and to an oscillator 103, an IF amplifier 107 coupled to an output of the mixer circuit 105 and a tuning deviation detection circuit 109 coupled to an output thereof such as, for example, a frequency or phase deviation detection circuit.

The receiver may be either a radio or a television receiver whose further signal processing sections are not important for understanding the invention and which have therefore been omitted for the sake of clarity.

The tuning deviation detection circuit 109 has an output 111, 113 which is connected to an input 8, 9 of a so-called multi-stabilisation circuit 115 of the integrated circuit type TCA 750. The numbers of the terminals (pins) of this TCA 750 correspond to the reference numerals mentioned here. Only the terminals which are of interest for an understanding of the invention are shown. For a more complete description reference is made to "Philips Product Information" 60 dated 18-3-1974. The TCA 750 receives a supply voltage at a terminal 13 and supplies a tuning voltage to a terminal 12 on which a tuning correction voltage (A.F.C.-voltage) is superimposed which is influenced by the tuning correction signal (A.F.C. signal) supplied to the terminals 8, 9. The tuning correction voltage can be put out of operation by a sufficiently large (larger than 0.8 V) positive or negative voltage at a terminal 11, a capacitor 117 which is connected to the terminal 5 determining the delay with which the tuning correction voltage becomes operative again after the disappearance of the tuning correction suppression signal at the input 11.

Connected to the terminal 12 is a tuning potentiometer 119 whose other side is grounded through a resistor 121. A tuning signal input 123 of the oscillator 103 and, if so desired of other parts of the receiver to be tuned is connected to the adjustable tap of the potentiometer 119.

The adjustment of a level adjusting potentiometer 125 is mechanically coupled to the adjustment of the tuning potentiometer 119. This is shown in the FIGURE by means of a dotted line. At one end the level adjusting potentiometer 125 is connected to a terminal 2 of the TCA 750 at which a stabilized voltage is available and on the other hand to earth through a resistor 127.

Through a differentiating network 129, 131 the adjustable tap on the level adjusting potentiometer is connected to an input of the amplifier 133, an output of which is connected to the tuning correction suppression signal input 11.

When the receiver is switched on or when the position of the tap on the tuning potentiometer 119 is varied the voltage at the tap of the level adjusting potentiometer 125 changes so that via the differentiating network 129, 131 and the amplifier 133 a voltage is produced at the terminal 11 of the TCA 750 which switches the automatic tuning correction off. After some time the latter is switched on again after the supply voltage and the position of the potentiometers 119, 125 do not change anymore. This time period can be influenced by the choice of the capacitance of the capacitor 117.

The stabilized voltage at the terminal 2 of the TCA 750 which supplies the level adjusting potentiometer is independent of the tuning circuit of the receiver so that, when assembling this tuning circuit the level variation detection circuit which is constituted by the circuit power supply terminal 2, level adjusting potentiometer 125, differentiating network 119, 131, amplifier 133 and tuning correction suppression signal terminal 11 need not be taken into account. This allows a great deal of freedom on designing the tuning circuit.

It will be clear that the use of the TCA 750 is not a condition for the use of the invention. It will be evident that other circuits having comparable functions may be used, for example as indicated in the above cited patent.

The output signal of the differentiating network 129, 131 of the amplifier 133 may also be used, if so desired, for example for the automatic change-over from remote control to a local control of the tuning of the receiver.

What is claimed is:

1. A circuit for use with an automatic tuning correction means, said circuit comprising a tuning potentiometer; an automatic tuning correction suppression circuit means coupled to said potentiometer and said automatic tuning correction means for rendering the automatic tuning correction means inactive during operation of said potentiometer and having a control signal input; and a level variation detector circuit having a level adjusting potentiometer mechanically coupled to said tuning potentiometer and electrically coupled to said suppression circuit means, said detector circuit also having an output coupled to said control signal input.

* * * * *